United States Patent
Haeberlen et al.

(10) Patent No.: US 9,646,855 B2
(45) Date of Patent: May 9, 2017

(54) SEMICONDUCTOR DEVICE WITH METAL CARRIER AND MANUFACTURING METHOD

(71) Applicant: Infineon Technologies Austria AG, Villach (AT)

(72) Inventors: Oliver Haeberlen, Villach (AT); Walter Rieger, Arnoldstein (AT); Christoph Kadow, Neuried (DE); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 85 days.

(21) Appl. No.: 14/711,198

(22) Filed: May 13, 2015

(65) Prior Publication Data
US 2015/0249020 A1 Sep. 3, 2015

Related U.S. Application Data

(63) Continuation of application No. 12/641,130, filed on Dec. 17, 2009, now abandoned.

(51) Int. Cl.
*H01L 21/683* (2006.01)
*H01L 31/0304* (2006.01)
(Continued)

(52) U.S. Cl.
CPC .... *H01L 21/4871* (2013.01); *H01L 21/76879* (2013.01); *H01L 29/0626* (2013.01);
(Continued)

(58) Field of Classification Search
CPC ......... H01L 21/6835; H01L 2221/6835; H01L 29/4175; H01L 21/4871; H01L 21/76879; H01L 29/41766
See application file for complete search history.

(56) References Cited

U.S. PATENT DOCUMENTS 5,476,810 A 12/1995 Curran
6,392,290 B1 5/2002 Kasem et al.
(Continued)

FOREIGN PATENT DOCUMENTS

CN 1407608 4/2003
EP 0948042 10/1999
(Continued)

OTHER PUBLICATIONS

Lee, J.H. Improved of Electrical Properties of MOCVD Grown Al(x)Ga(1-x)N/GaN Heterostructure with Isoelectronic Al-Doped Channel. In: phys. stats. sol. (c), 0, Accepted Oct. 1, 2002, No. 1, 240-243. (4 pgs.).

(Continued)

*Primary Examiner* — Raj R Gupta
(74) *Attorney, Agent, or Firm* — Dicke, Billig & Czaja, PLLC

(57) ABSTRACT

Semiconductor device including a metal carrier substrate. Above the carrier substrate a first semiconductor layer of $Al_{x1}Ga_{y1}In_{z1}N$ (x1+y1+z1=1, x1≥0, y1≥0, z1≥0) is formed. A second semiconductor layer of $Al_{x2}Ga_{y2}In_{z2}N$ (x2+y2+z2=1, x2>x1, y2≥0, z2≥0) is arranged on the first semiconductor layer and a gate region is arranged on the second semiconductor layer. The semiconductor device furthermore includes a source region and a drain region, wherein one of these regions is electrically coupled to the metal carrier substrate and includes a conductive region extending through the first semiconductor layer.

22 Claims, 17 Drawing Sheets

(51) Int. Cl.
  *H01L 21/48* (2006.01)
  *H01L 29/06* (2006.01)
  *H01L 29/417* (2006.01)
  *H01L 29/66* (2006.01)
  *H01L 29/778* (2006.01)
  *H01L 21/768* (2006.01)
  *H01L 29/20* (2006.01)

(52) U.S. Cl.
  CPC .. *H01L 29/41766* (2013.01); *H01L 29/66462* (2013.01); *H01L 29/7787* (2013.01); *H01L 29/2003* (2013.01); *H01L 2924/0002* (2013.01)

(56) References Cited

U.S. PATENT DOCUMENTS

| | | | |
|---|---|---|---|
| 6,580,107 B2 | 6/2003 | Asano et al. | |
| 7,307,010 B2 | 12/2007 | Rieger | |
| 7,829,957 B2* | 11/2010 | Kato | H01L 21/8252 257/205 |
| 2006/0108602 A1* | 5/2006 | Tanimoto | H01L 21/6835 257/192 |
| 2006/0237711 A1 | 10/2006 | Teraguchi | |
| 2007/0020884 A1 | 1/2007 | Wang et al. | |
| 2008/0079023 A1 | 4/2008 | Hikita et al. | |
| 2008/0135854 A1 | 6/2008 | Akamatsu et al. | |
| 2008/0157060 A1 | 7/2008 | Brar et al. | |
| 2008/0258150 A1 | 10/2008 | McCarthy et al. | |
| 2009/0001478 A1* | 1/2009 | Okamoto | H01L 21/76898 257/382 |
| 2009/0032830 A1 | 2/2009 | Li | |
| 2011/0006345 A1 | 1/2011 | Ota et al. | |
| 2011/0057232 A1 | 3/2011 | Sheppard et al. | |
| 2011/0084341 A1 | 4/2011 | Kosaka | |

FOREIGN PATENT DOCUMENTS

| | | |
|---|---|---|
| EP | 1217655 | 6/2002 |
| JP | 2008-91392 | 11/2009 |
| JP | 2009-283915 | 12/2009 |
| JP | 2009-283960 | 12/2009 |
| JP | 2009-289935 | 7/2011 |
| WO | 2009/110254 | 9/2009 |

OTHER PUBLICATIONS

"Dopant Activation and Ultralow Resistance Ohmic Contacts to Si-ion-implanted GaN Using Pressurized Rapid Thermall Annealing", Haijiang Yu, et al., Nov. 29, 2004, vol. 85, No. 22, Applied Physics Letters.

* cited by examiner

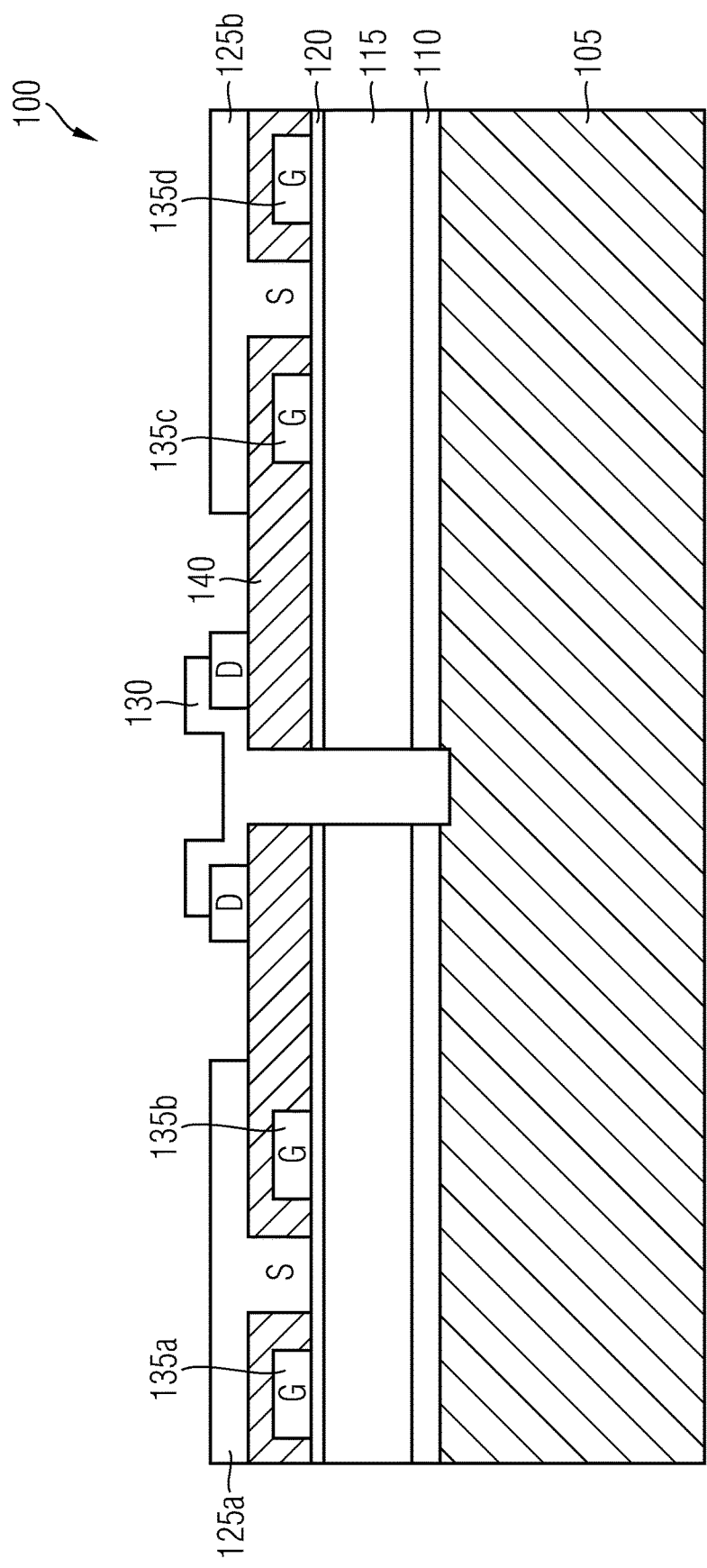

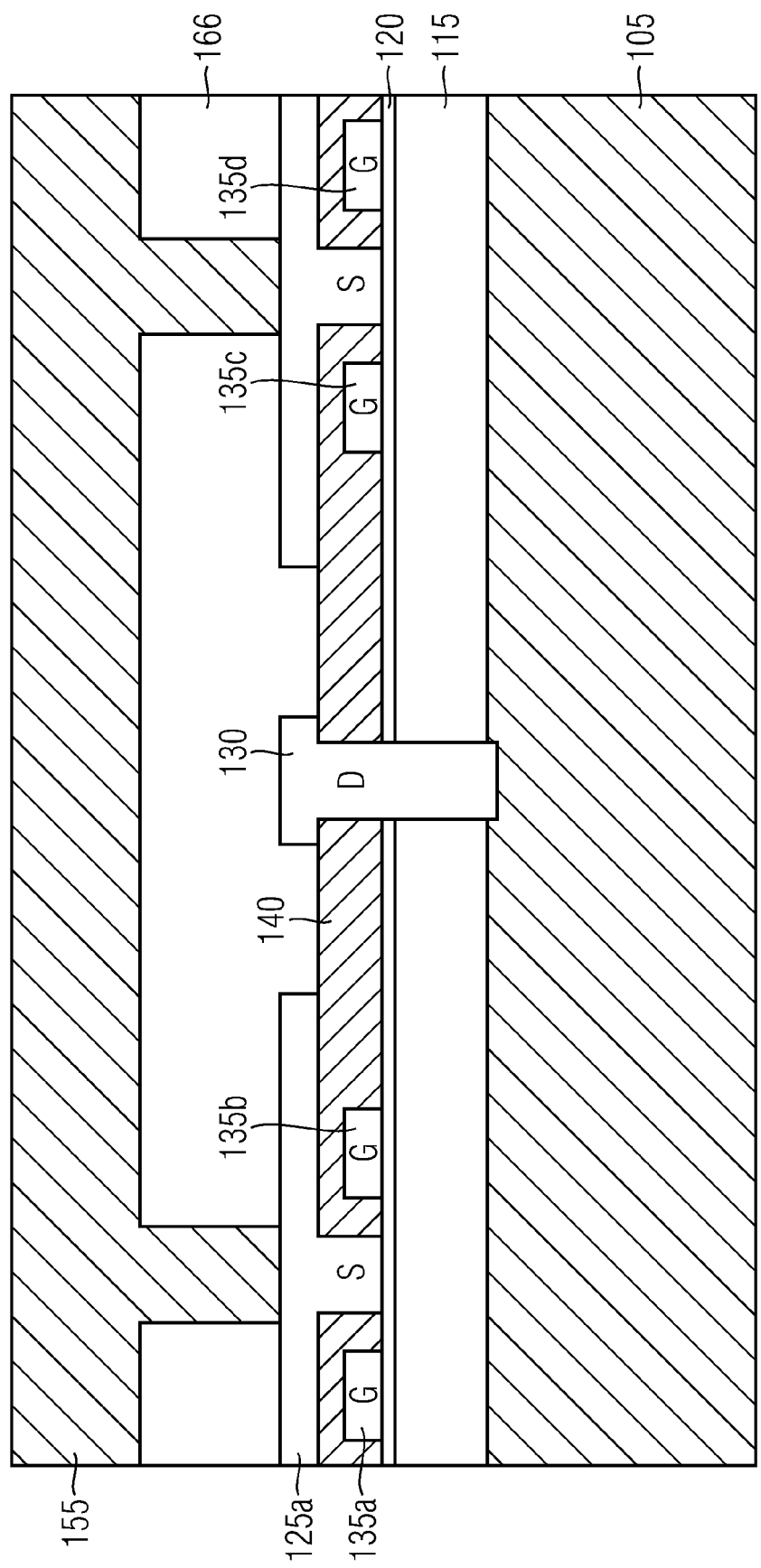

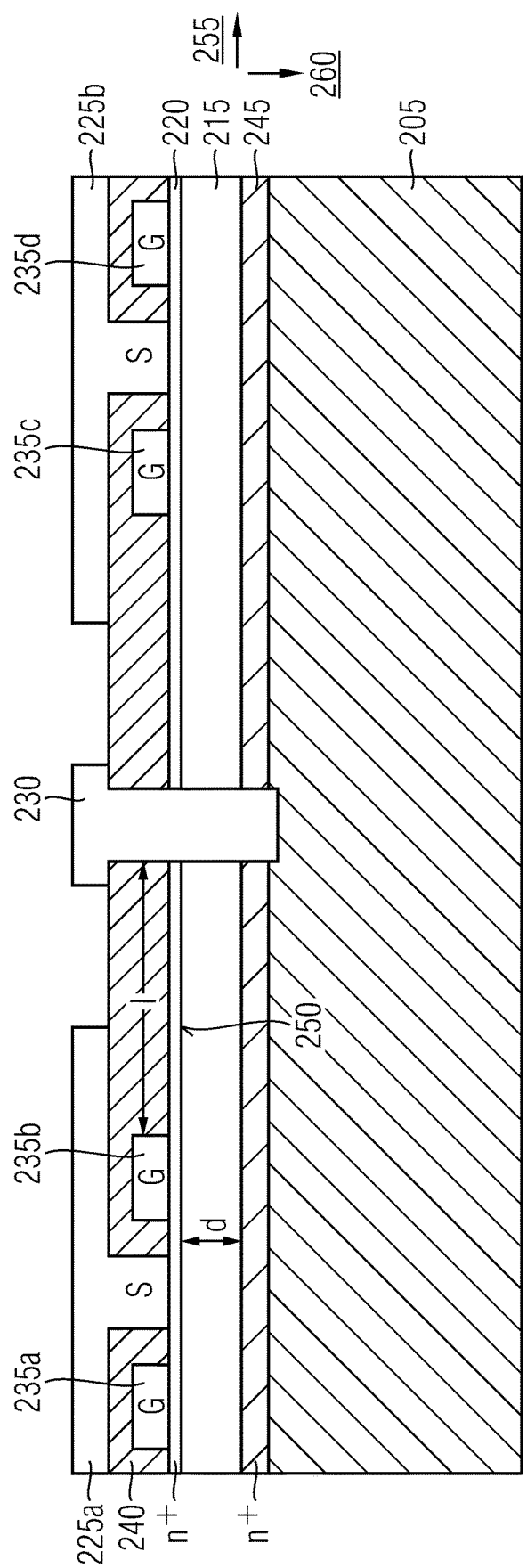

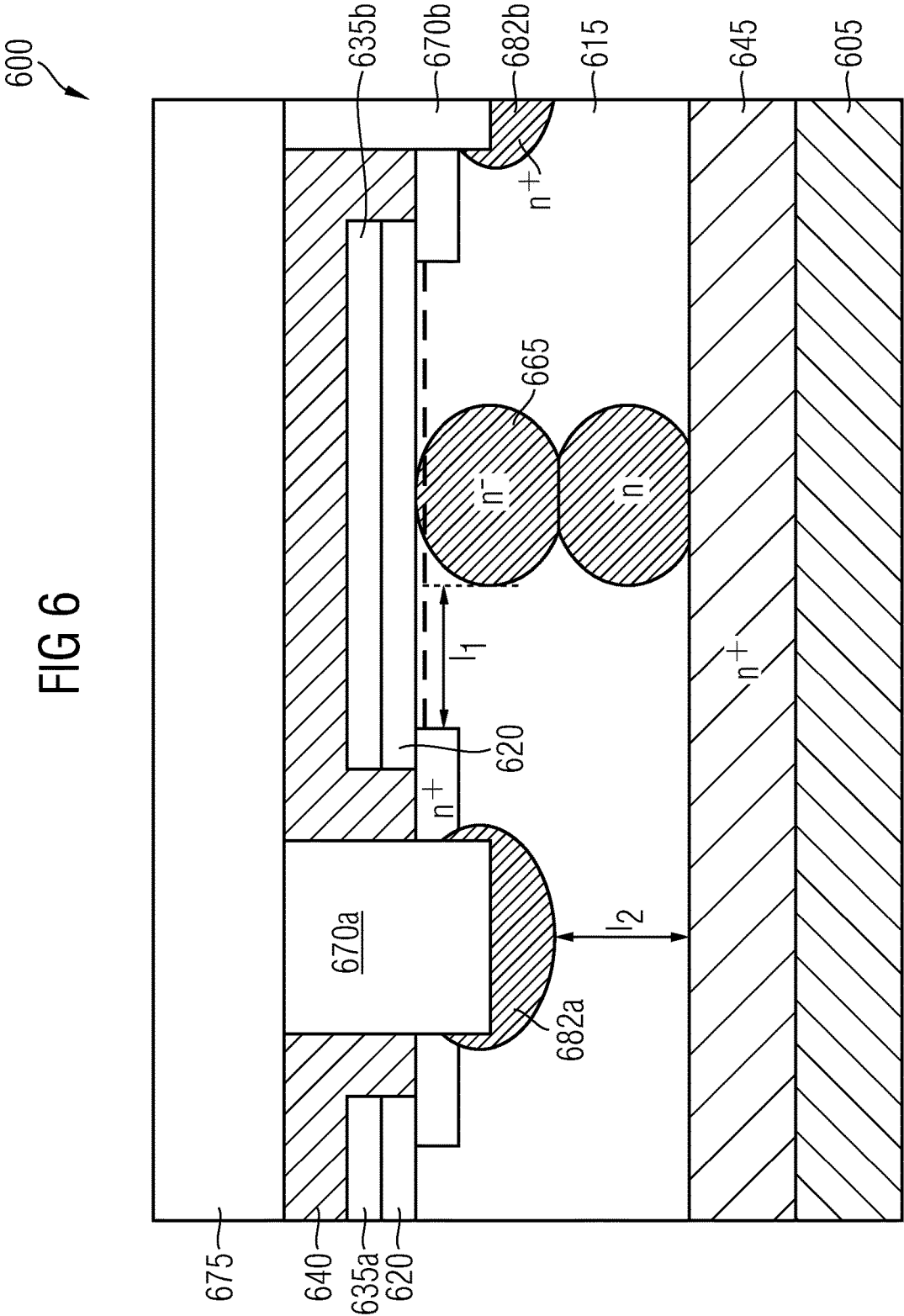

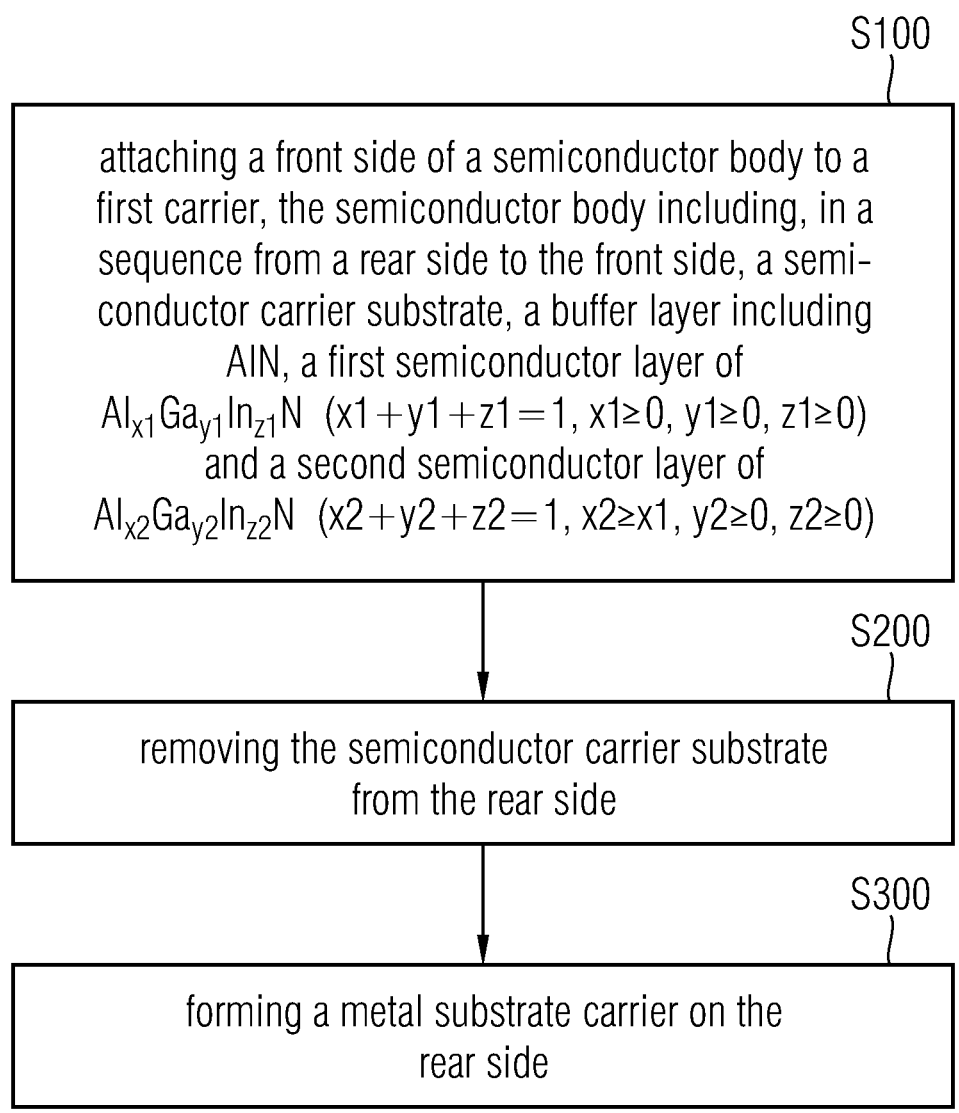

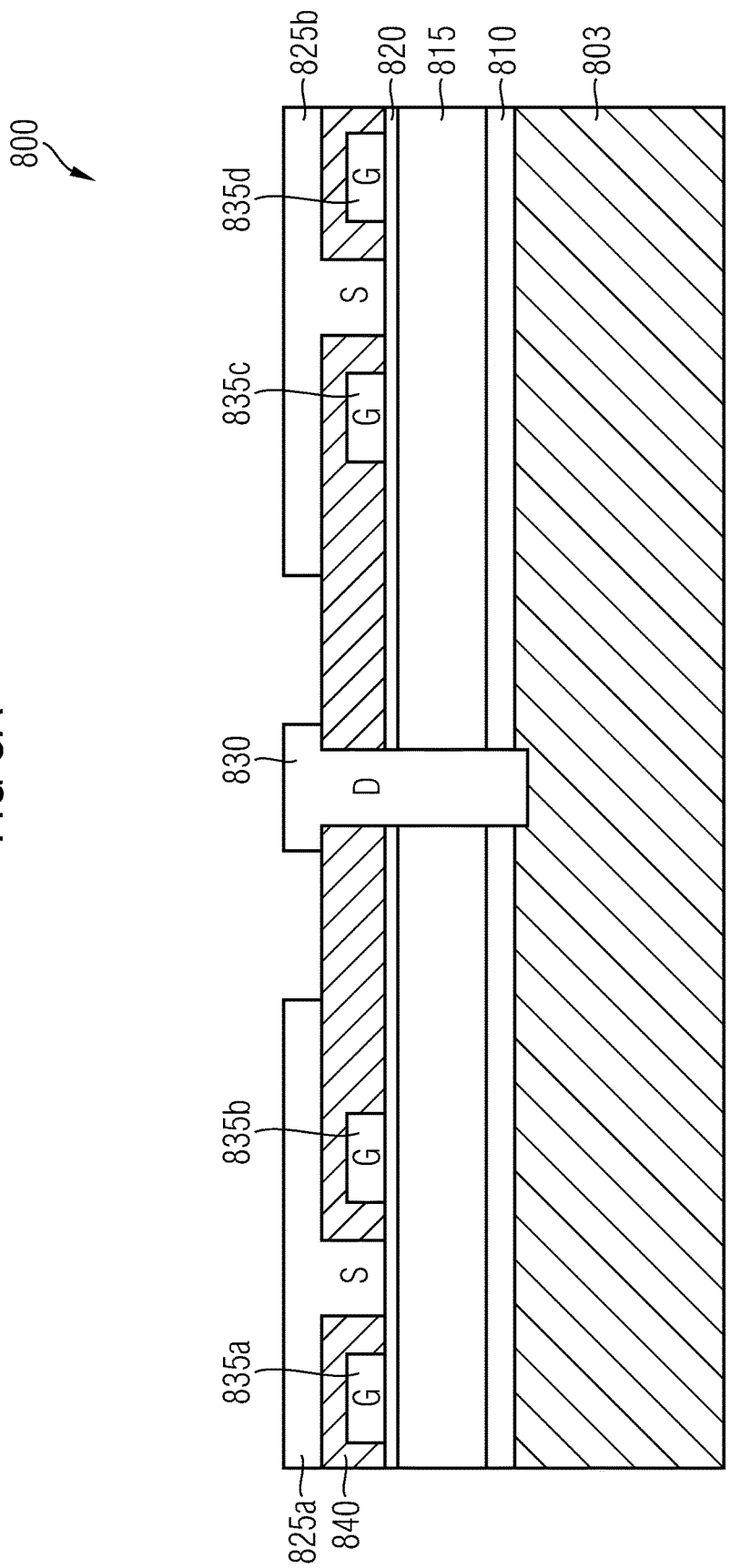

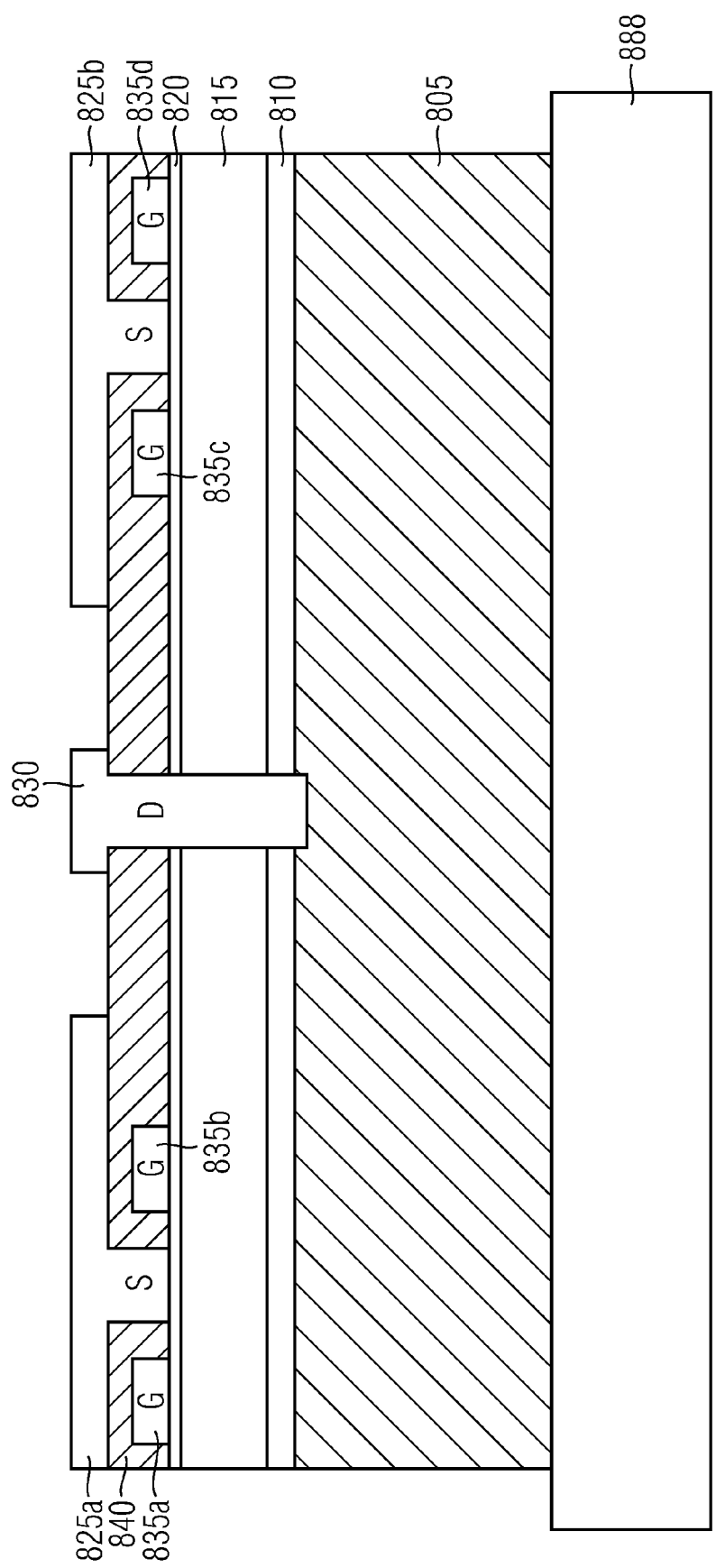

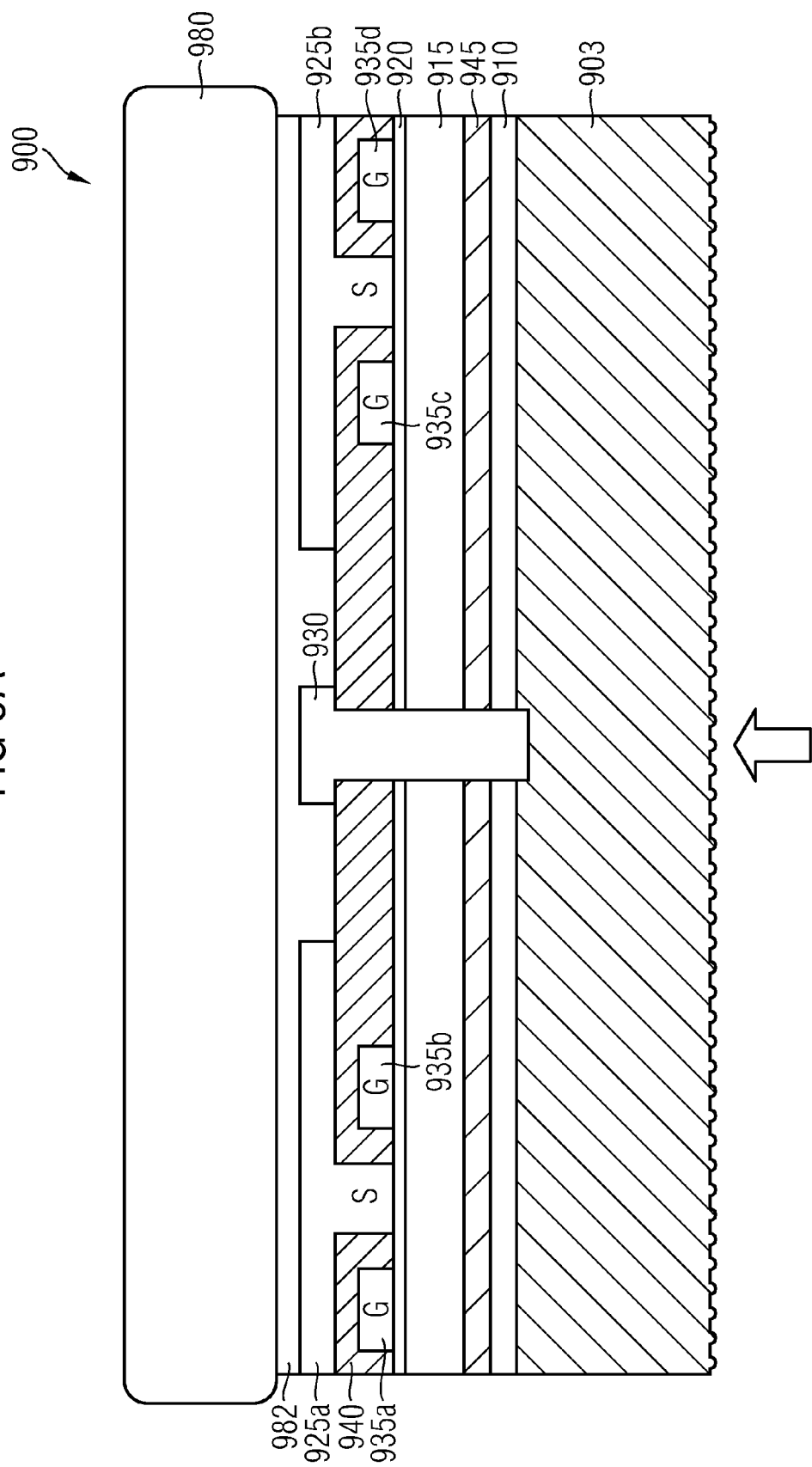

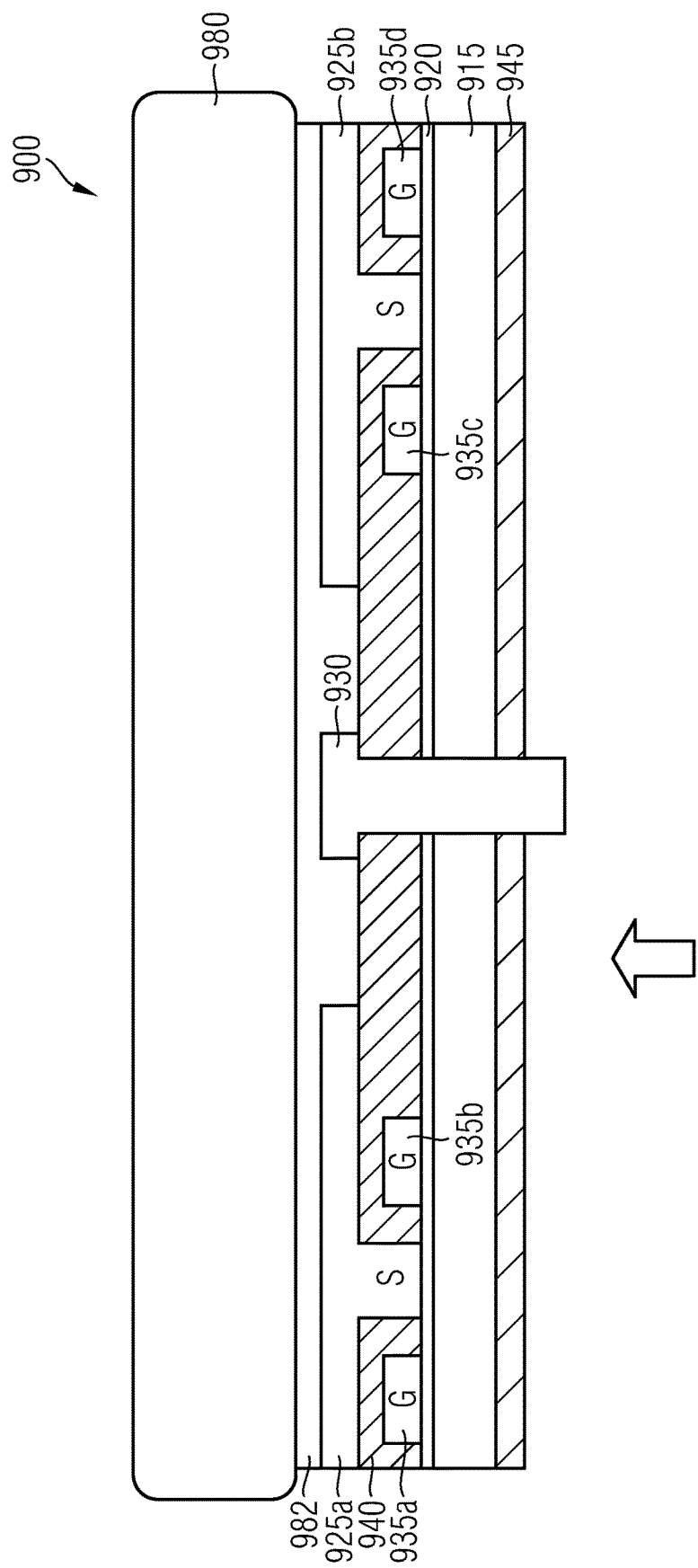

SEMICONDUCTOR DEVICE WITH METAL CARRIER AND MANUFACTURING METHOD

CROSS-REFERENCE TO RELATED APPLICATIONS

This Utility Patent Application is a continuation application of U.S. application Ser. No. 12/641,130, filed Dec. 17, 2009, which is incorporated herein by reference.

BACKGROUND OF THE INVENTION

Power semiconductor devices such as Field Effect Transistors (FETs) and High Electron Mobility Transistors (HEMTs) are widely used for applications such as power switch circuits. Examples for requirements on these devices are low area specific on-resistance $R_{ON} \times A$, high breakdown voltage $V_{BR}$, and high robustness under electrical breakdown conditions.

Power semiconductor devices based on wide band gap semiconductor materials such as GaN allow for low specific on-resistance. Reduction of the specific on-resistance is accompanied by requirements on improved heat dissipation and improved device robustness.

A need exists for a nitride semiconductor power device having improved heat dissipation and improved device robustness For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts. The features of the various illustrated embodiments can be combined in any way unless they exclude each other. For differentiation of different layers, a numbering such as first layer, second layer and third layer is used. The numbering only serves to distinguish between these layers and is independent from any sequence of manufacture.

FIG. 1A is a cross-sectional view illustrating one embodiment of a semiconductor device including a portion of a nitride semiconductor power device including a carrier substrate made of metal.

FIG. 1B is a cross-sectional view illustrating one embodiment of a semiconductor device including a portion of a nitride semiconductor power device including a carrier substrate made of metal and source regions electrically coupled to a contact pad arranged on top of an active area of the device.

FIG. 2 is a cross-sectional view illustrating one embodiment of a semiconductor device including a portion of a nitride semiconductor power device including a carrier substrate made of metal and a doped nitride semiconductor layer for fixing avalanche breakdown.

FIG. 6 is a cross-sectional view illustrating one embodiment of a semiconductor device including a portion of a nitride semiconductor power device including a doped nitride semiconductor zone and a trench contact for fixing avalanche breakdown.

FIG. 7 is a simplified flowchart illustrating one embodiment of a method for manufacturing a nitride semiconductor power device according to an embodiment.

FIGS. 8A to 8E are cross-sectional views illustrating one embodiment of a semiconductor portion during manufacture of a nitride semiconductor power device similar to the one illustrated in FIG. 1A.

FIGS. 9A to 9C are cross-sectional views illustrating one embodiment of a semiconductor portion during manufacture of the nitride semiconductor power device illustrated in FIG. 2.

DETAILED DESCRIPTION OF THE INVENTION

Figure 3:
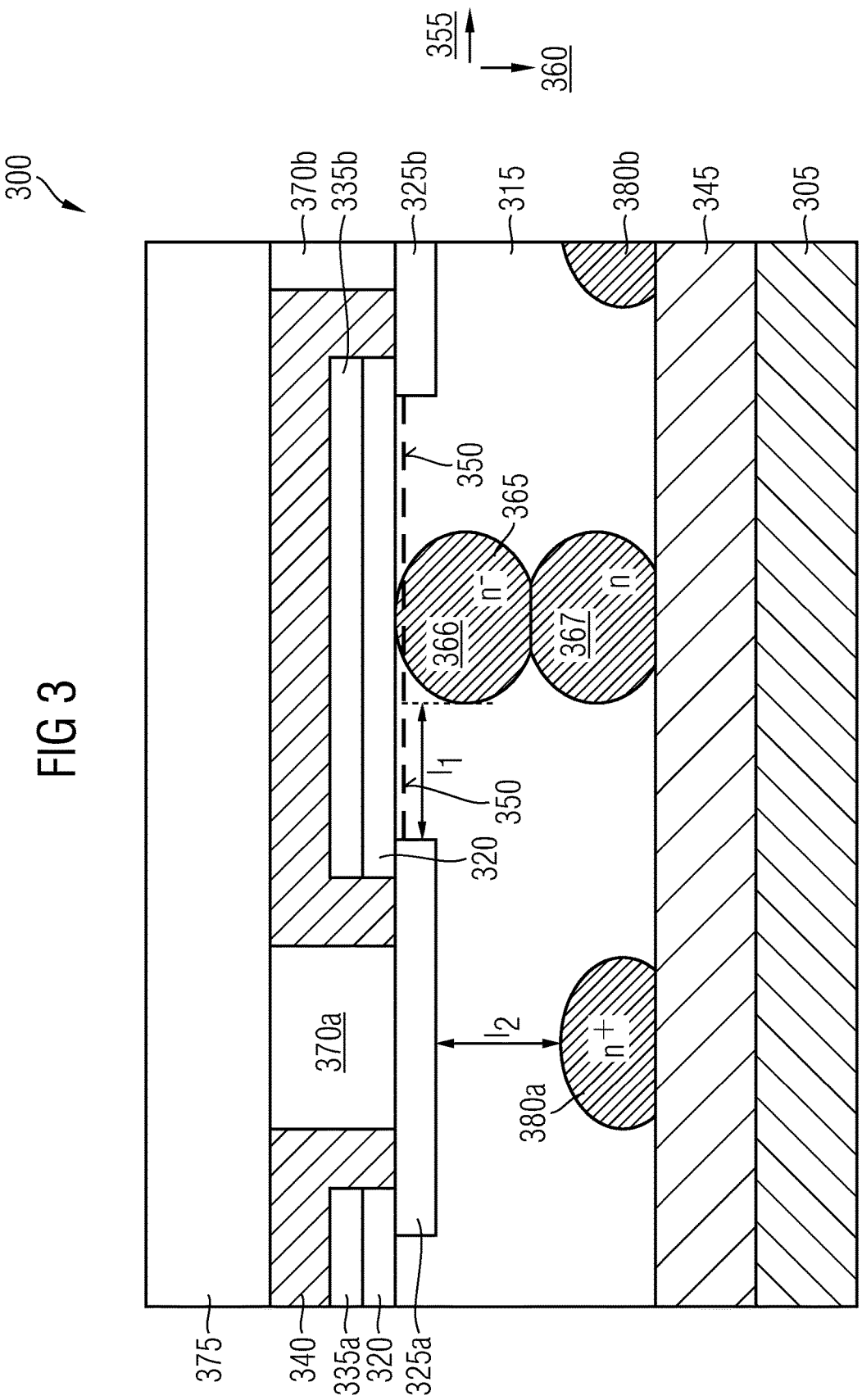
FIG. 3 is a cross-sectional view illustrating one embodiment of a semiconductor device including a portion of a nitride semiconductor power device including a doped nitride semiconductor zone for fixing avalanche breakdown.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1A illustrates one embodiment of a schematic cross-sectional view of a semiconductor device, in one embodiment a portion of a lateral channel HEMT 100. HEMT 100 includes a carrier substrate 105 made of metal, e.g. Cu. On carrier substrate 105, an optional buffer layer 110 such as an MN buffer layer is arranged. On buffer layer 110, a first semiconductor layer 115 of $Al_{x1}Ga_{y1}In_{z1}N$ (x1+y1+z1=1, x1≥0, y1≥0, z1≥0), e.g. intrinsic GaN or GaN including at least one of Fe, C, Mg, in a concentration smaller than $5 \times 10^{17}$ cm$^{-3}$, or smaller $10^{18}$ cm$^{-3}$ or smaller than $5 \times 10^{18}$ cm$^{-3}$ is arranged. On the first semiconductor layer 115, a second semiconductor layer 120 of $Al_{x2}Ga_{y2}In_{z2}N$ (x2+y2+z2=1, x2>x1, y2≥0, z2≥0), e.g. AlGaN or InGaN, is arranged, either doped or undoped, optionally capped with a thin layer of GaN.

Source regions 125a, 125b and drain region 130 are electrically coupled to the second semiconductor layer 120. Gate regions 135a . . . 135d are arranged on the second semiconductor layer 120. The gate regions 135a . . . 135d may include metal and/or conductive semiconductor material such as doped polysilicon or p-doped GaN. The gate regions 135a . . . 135d may also include additional dielectric layers below the conductive gate region, e.g. similar to a MISFET (Metal-Insulator-FET). The conductivity between source and drain, e.g. between source region 125a and drain region 130, may be controlled by applying a voltage to the gate regions 135a . . . 135d, e.g. gate region 135b. An insulating layer 140, e.g. a $Si_3N_4$ or $SiO_2$ layer, is formed on the second semiconductor layer 120.

The drain region 130, which may include one or several conductive parts formed of metal such as Ti/Al or doped semiconductor material, is electrically coupled to the carrier substrate 105 and includes a conductive part extending through the second semiconductor layer 120, the first semiconductor layer 115 and the buffer layer 110 to the carrier substrate 105. The source regions 125a, 125b are electrically coupled to a contact area, e.g. a contact pad, at the front side. This contact pad may also be formed as part of a multi-metal layer system arranged on top of the active area of the device. According to another example, the source regions are electrically coupled to the carrier substrate at a rear side and the drain regions are electrically coupled to a contact area, e.g. a contact pad, at the front side.

A thickness of the carrier substrate 105 is appropriately chosen to provide mechanical stability to the layer stack arranged thereon. In addition, the carrier substrate supports dissipation of heat generated in the device arranged thereon in an operation mode of the device. As an example, the thickness of a carrier substrate 105 made of Cu may be between 15 µm to 50 µm, in particular between 30 µm to 40 µm. A metal layer of a same or different material than carrier substrate 105 may also be formed on the front side opposite to the rear side where the carrier substrate 105 is formed. In this case, each one of the carrier substrate at the rear side and the metal layer at the front side may contribute to the mechanical stability and may each have a thickness between 10 µm to 40 µm, in one embodiment between 20 to 30 µm. The metal carrier substrate(s) improve dissipation of heat during operation mode of the power semiconductor device(s) formed thereon. Omitting the buffer layer 110 may improve heat dissipation since this buffer layer which supports growth of GaN layers on initial silicon substrates may decrease heat dissipation due to a high thermal boundary resistance.

FIG. 1B illustrates a cross-sectional view of one embodiment of a semiconductor device including a portion of a lateral channel HEMT 100 that differs from the embodiment illustrated in FIG. 1A in that the source regions 125a, 125b are electrically coupled to a contact area, e.g. a contact pad 155 at the front side. The contact pad 155 is formed as part of a multi- or single-metal layer system including metals such as Cu arranged on top of the active area of the device. Furthermore, buffer layer 110 illustrated in FIG. 1A is omitted to improve heat dissipation as described above. An interlayer dielectric 160 may be provided to electrically insulate conductive regions from each other.

FIG. 2 is a cross-sectional view illustrating one embodiment of a semiconductor device including a portion of a lateral channel HEMT 200. HEMT 200 differs from HEMT 100 illustrated in FIG. 1A in that buffer layer 110 is replaced by a third semiconductor layer 245 including $Al_{x3}Ga_{y3}In_{z3}N$ (x3+y3+z3=1, x2>x3, y3≥0, z3≥0). The third semiconductor layer 245 is in contact with the first semiconductor layer 215 and includes an average concentration of dopants higher than $10^{17}$ cm$^{-3}$.

In an OFF state, a vertical avalanche breakdown voltage between the second semiconductor layer 220, the first semiconductor layer 215 and the third semiconductor layer is set smaller than the lateral breakdown voltage between gate, e.g. gate region 235d, and drain, e.g. drain region 230. Thus a channel region of HEMT 200 located at an interface 250 between the first semiconductor layer 215 and the second semiconductor layer 220 may be prevented from damage due to hot carrier degradation or other electrical stress mechanisms.

As an example, a distance l between gate, e.g. gate region 235b, and drain, e.g. drain region 230, along a lateral direction 255 may be set larger than a thickness d of the first semiconductor layer 215 along a vertical direction 260 extending perpendicular to the lateral direction 255.

The concentration of dopants of the third semiconductor layer 245 may be chosen high enough to provide a beneficial ohmic contact to the carrier substrate 205, e.g. higher than $10^{17}$ cm$^{-3}$, higher than $10^{18}$ cm$^{-3}$ or even higher than $10^{19}$ cm$^{-3}$. A conductivity type of the third semiconductor layer 245 may equal the conductivity type of the second semiconductor layer 220, e.g. both conductivity types being n-type or p-type. In another embodiment, the conductivity type of the third semiconductor layer 245 may differ from the conductivity type of the second semiconductor layer 220, e.g. the conductivity type of the third semiconductor layer 245 being p-type and the conductivity type of the second semiconductor layer being n-type.

FIG. 3 is a cross-sectional view illustrating one embodiment of a semiconductor device including a portion of a lateral channel HEMT 300. HEMT 300 includes a carrier substrate 305 made of metal, e.g. Cu, doped Si such as n$^+$-type Si, SiC or GaN, for example. On carrier substrate 305, a third semiconductor layer 345 is arranged. Third semiconductor layer 345 can be similar to third semiconductor layer 245 illustrated in FIG. 2. The carrier substrate 305 and the third semiconductor layer 345 constitute a drain of HEMT 300.

On third semiconductor layer 345, a first semiconductor layer 315 similar to first semiconductor layers 115, 215 illustrated in FIGS. 1A and 2 is arranged. On first semiconductor layer 315, a second semiconductor layer 320 of $Al_{x2}Ga_{y2}In_{z2}N$ (x2+y2+z2=1, x2>x1, y2≥0, z2≥0), e.g. AlGaN, is arranged. In one or more embodiments, the second semiconductor layer 320 may be in the shape of stripes, columns, rings, hexagons, octagons and complementary structures, for example.

Gate regions 335a, 335b are arranged on the second semiconductor layer 320. The gate regions 335a, 335b may include metal and/or conductive semiconductor material such as doped polysilicon. The gate regions 335a, 335b may be congruent with the second semiconductor layer 320.

Source regions 325a, 325b are embedded in the first semiconductor layer 315, the source regions including a concentration of dopants higher than $10^{17}$ cm$^{-3}$. The source regions 325a, 325b may be self-aligned to the second semiconductor layer 320 and the gate regions 325a, 325b.

A drift region 365 including a concentration of activated dopants higher than $10^{14}$ cm$^{-3}$ extends through the first semiconductor layer 315. If the device is turned ON, the drift region provides a conductive path between the third semiconductor layer 345 and a channel region located at an interface 350 between the first semiconductor layer 315 and the second semiconductor layer 320. If the device is turned OFF, the drift region is partly depleted and contributes to the electrical isolation between source and drain. Shape and doping profile of the drift region may be chosen accordingly. The drift region 365 may include one doped semiconductor zone or a plurality of doped semiconductor zones overlapping each other in the vertical direction 360. In case of a plurality of doped and overlapping semiconductor zones, an average concentration within each of these zones may decrease in a direction from the third semiconductor layer 345 to the second semiconductor layer 320, for example, such as n⁻-type zone 366 and n-type zone 367 illustrated in FIG. 3.

The conductivity between source and drain, i.e. between source region 325a and drift region 365, may be controlled by applying a voltage to the gate, i.e. gate region 335a. An insulating layer 340, e.g. a SiN or $SiO_2$ layer, is formed on the second semiconductor layer 320 and the source regions 325a, 325b. Contact plugs 370a, 370b are formed within apertures of the insulating layer 340 and electrically couple the source regions 325a, 325b to a wiring level 375, e.g. a metal layer.

First avalanche regions 380a, 380b are formed within the first semiconductor layer 315, the first avalanche regions 380a, 380b being arranged opposite to the source, e.g. source regions 325a, 325b. The first avalanche regions 380a, 380b are in contact with the third semiconductor layer 345 and include an average concentration of activated dopants higher than $10^{17}$ cm$^{-3}$.

In an OFF state, a vertical avalanche breakdown voltage between source, e.g. source region 325a, and drain, e.g. third semiconductor layer 345, is set smaller than the lateral breakdown voltage between gate, e.g. gate region 335b, and the drift zone 365, e.g. by appropriate choice of dimensions and dopant concentrations of first avalanche regions 380a, 380b. Thus a channel region of HEMT 300 located at the interface 250 between the first semiconductor layer 315 and the second semiconductor layer 320 may be prevented from damage by hot carrier degradation or other electrical stress mechanisms.

In one embodiment, a distance $l_1$ between source, e.g. source region 325a, and an undepleted part of the drift region 365 along a lateral direction 355 may be set larger than a distance $l_2$ between a top side of the first avalanche regions, e.g. first avalanche region 380a, and a bottom side of the source, e.g. source region 325a, along a vertical direction 360 extending perpendicular to the lateral direction 355.

A threshold voltage Vth of HEMT 300 may be adjusted by choice of the gate material, the thickness of the second semiconductor layer 320, the concentration of dopants within the second semiconductor layer 320 and piezoelectric effects, for example. HEMT 300 may be a depletion mode transistor (Vth<0V) or an enhancement mode transistor (Vth>0V).

Source regions 325a, 325b, drift region 365 and first avalanche regions 380a, 380b may be formed by implanting dopants such as Si, Ge or O into the first semiconductor layer 315, for example. These regions may also be formed by epitaxial regrowth, for example. These regions may also have a same conductivity type, e.g. an n-type.

HEMT 300 exhibits an improved avalanche robustness. As a further example of arrangement of source and drain, both of them may be electrically coupled at a front side and the avalanche regions 380a, 380b may be electrically coupled to a contact region at a front side of the semiconductor device via the carrier substrate, a lead frame and a bond wire.

Figure 4:
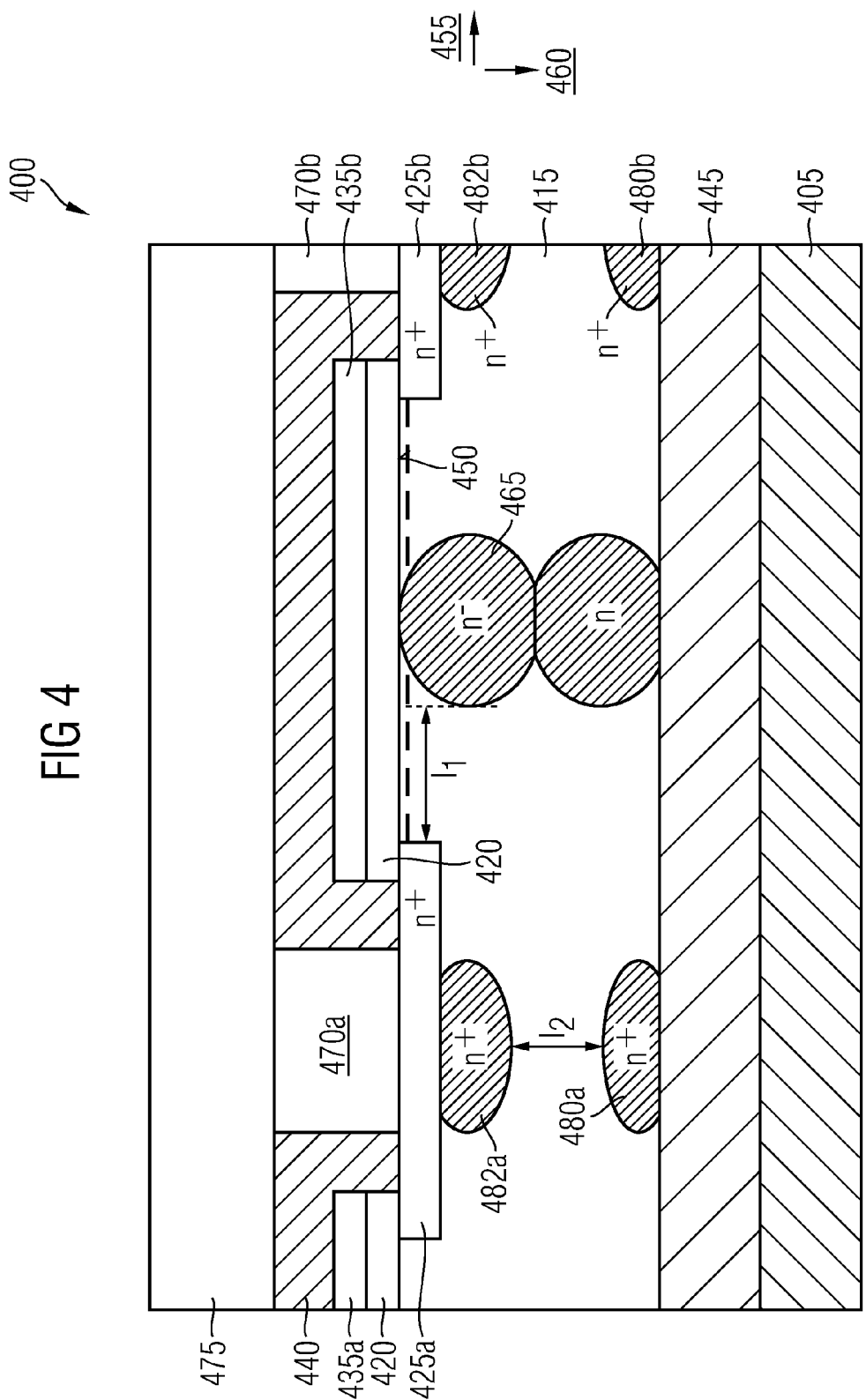
FIG. 4 is a cross-sectional view illustrating one embodiment of a semiconductor device including a portion of a nitride semiconductor power device including doped nitride semiconductor zones of same conductivity type for fixing avalanche breakdown.

FIG. 4 is a cross-sectional view illustrating one embodiment of a semiconductor device including a portion of a lateral channel HEMT 400. HEMT 400 differs from HEMT 300 illustrated in FIG. 3 in that second avalanche regions 482a, 482b are provided, the second avalanche regions 482a, 482b being arranged opposite to the first avalanche regions 480a, 480b. A conductivity type of the second avalanche regions 482a, 482b equals the conductivity type of the first avalanche regions. Dimensions and concentration of dopants of the second avalanche regions may be similar to the first avalanche regions 480a, 480b.

In an OFF state, a vertical avalanche breakdown voltage between source, e.g. source region 425a, and drain, e.g. third semiconductor layer 445, is set smaller than the lateral breakdown voltage between gate, e.g. gate region 435b, and the drift region 465, e.g. by appropriate choice of dimensions and dopant concentrations of the first and second avalanche regions 480a, 480b, 482a, 482b. In one embodiment, a distance $l_1$ between source, e.g. source region 425a, and an undepleted part of the drift region 465 along a lateral direction 455 may be set larger than a distance $l_2$ between the first and second avalanche regions 480a, 480b, 482a, 482b along a vertical direction 460 extending perpendicular to the lateral direction 455. Thus a channel region of HEMT 400 located at the interface 450 between the first semiconductor layer 415 and the second semiconductor layer 420 may be prevented from damage by hot carrier degradation or other electrical stress mechanisms.

Figure 5:
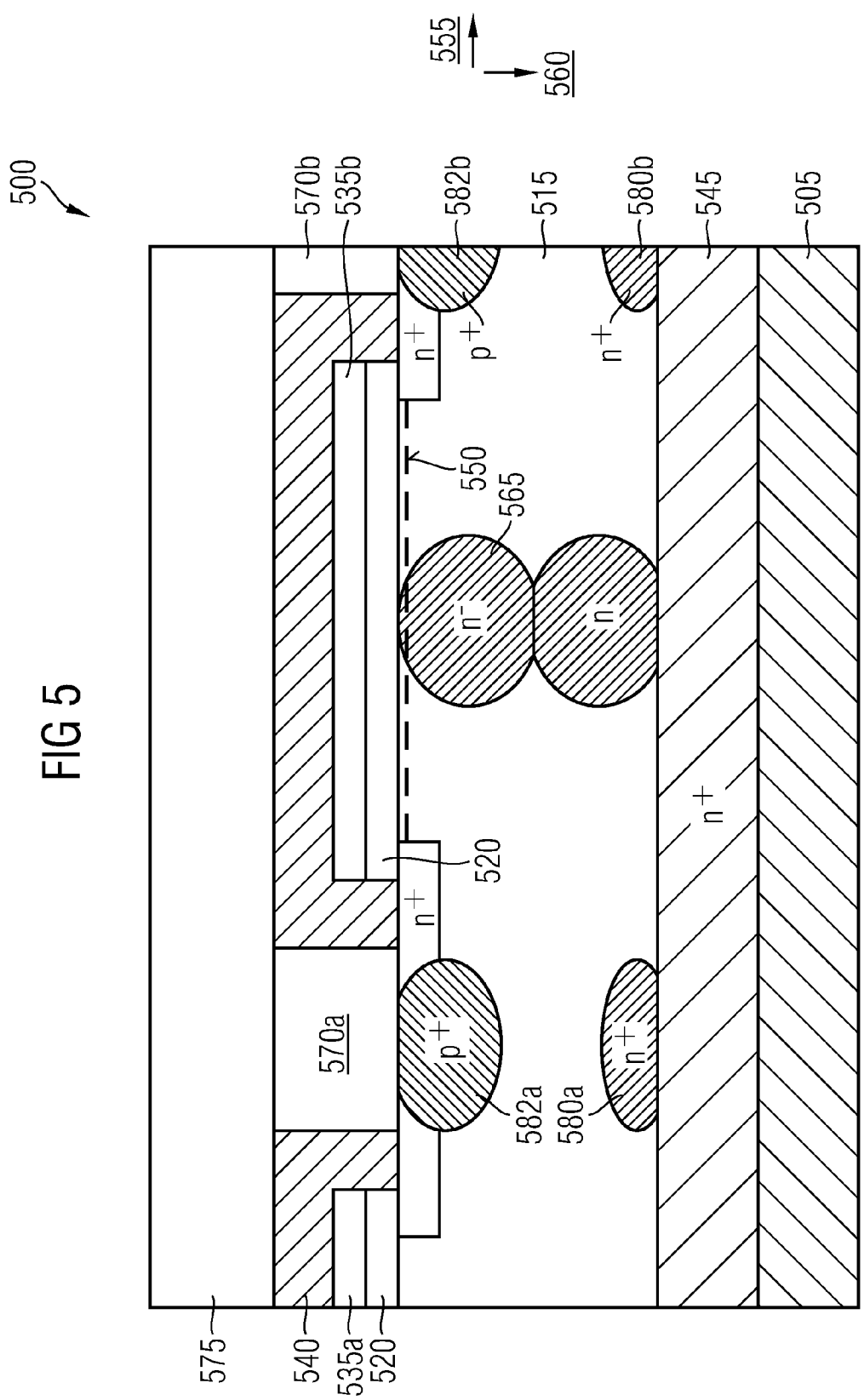
FIG. 5 is a cross-sectional view illustrating one embodiment of a semiconductor device including a portion of a nitride semiconductor power device including doped nitride semiconductor zones of different conductivity type for fixing avalanche breakdown.

FIG. 5 is a cross-sectional view illustrating one embodiment of a semiconductor device including a portion of a lateral channel HEMT 500. HEMT 500 differs from HEMT 400 illustrated in FIG. 4 in that the second avalanche regions 582a, 582b are of opposite conductivity type than the first avalanche regions 580a, 580b. In one embodiment illustrated in FIG. 5, the second avalanche regions 582a, 582b are of p⁺-type and the first avalanche regions 580a, 580b are of n⁺-type. This arrangement is beneficial with regard to efficient discharge of avalanche current flowing into the second avalanche regions 582a, 582b, since this avalanche current is a hole current flowing into a p⁺-type region. In case of second avalanche regions 582a, 582b of n-type, the hole avalanche current will be injected into these regions and the injected holes will recombine within these regions. As an example, recombination centers may be formed within the second avalanche regions 582a, 582, 482a, 482b and/or below a bottom side of these regions to enhance recombination of injected carriers in avalanche breakdown operation.

FIG. 6 is a cross-sectional view illustrating one embodiment of a semiconductor device including a portion of a lateral channel HEMT 600. HEMT 600 differs from HEMT 400 illustrated in FIG. 4 in that the first avalanche regions 482a, 482b are omitted and the contact plugs 670a, 670b partly extend into the source regions 625a, 625b and the second avalanche regions 682a, 682b as trench contacts.

In an OFF state, a vertical avalanche breakdown voltage between source, e.g. source region 625a, and drain, e.g. third semiconductor layer 645, is set smaller than the lateral breakdown voltage between source, e.g. source region 625a, and the undepleted part of the drift zone 665, e.g. by appropriate choice of dimensions and dopant concentrations of the second avalanche regions 682a, 682b and the trench contacts. As an example, a distance $l_1$ between source, e.g. source region 625a, and drift region 665 along a lateral direction 655 may be set larger than a distance $l_2$ between the second avalanche regions 682a, 682b and the third semiconductor layer 645 along a vertical direction 660 extending perpendicular to the lateral direction 655.

FIG. 7 illustrates a simplified flowchart of a method for manufacturing a nitride semiconductor power device according to one embodiment.

At S100, a front side of a semiconductor body is attached to a first carrier, the semiconductor body including, in a sequence from a rear side to the front side, a semiconductor carrier substrate, a buffer layer including MN, a first semiconductor layer, in one embodiment made of $Al_{x1}Ga_{y1}In_{z1}N$ (x1+y1+z1=1, x1≥0, y1≥0, z1≥0) and a second semiconductor layer in one embodiment made of $Al_{x2}Ga_{y2}In_{z2}N$ (x2+y2+z2=1, x2>x1, y2≥0, z2≥0).

At S200, the semiconductor carrier substrate is removed from the rear side.

At S300, a metal substrate carrier is formed on the rear side.

The metal substrate carrier improves dissipation of heat generated during operation of a nitride semiconductor power device formed thereon.

FIGS. 8A to 8E are cross-sectional views illustrating one embodiment of a semiconductor device including a semiconductor portion, during one example of manufacture of a nitride semiconductor power device similar to the one illustrated in FIG. 1A.

Referring to the schematic cross-sectional view of FIG. 8A, a semiconductor body 800 is provided, the semiconductor body 800 including, in a sequence from a rear side to the front side, a semiconductor carrier substrate 803, e.g. a Si substrate, a buffer layer 810 including MN, a first semiconductor layer 815 of $Al_{x1}Ga_{y1}In_{z1}N$ (x1+y1+z1=1, x1≥0, y1≥0, z1≥0) and a second semiconductor layer 820 of $Al_{x2}Ga_{y2}In_{z2}N$ (x2+y2+z2=1, x2>x1, y2≥0, z2≥0). Source regions 825a, 825b and a drain region 830 are electrically coupled to the second semiconductor layer 820. Gate regions 835a ... 835d are arranged on the second semiconductor layer 820. The gate regions 135a ... 135d may include metal and/or An insulating layer 140, e.g. a SiN or SiO$_2$ layer, is formed on the second semiconductor layer 120.

Figure 8B:
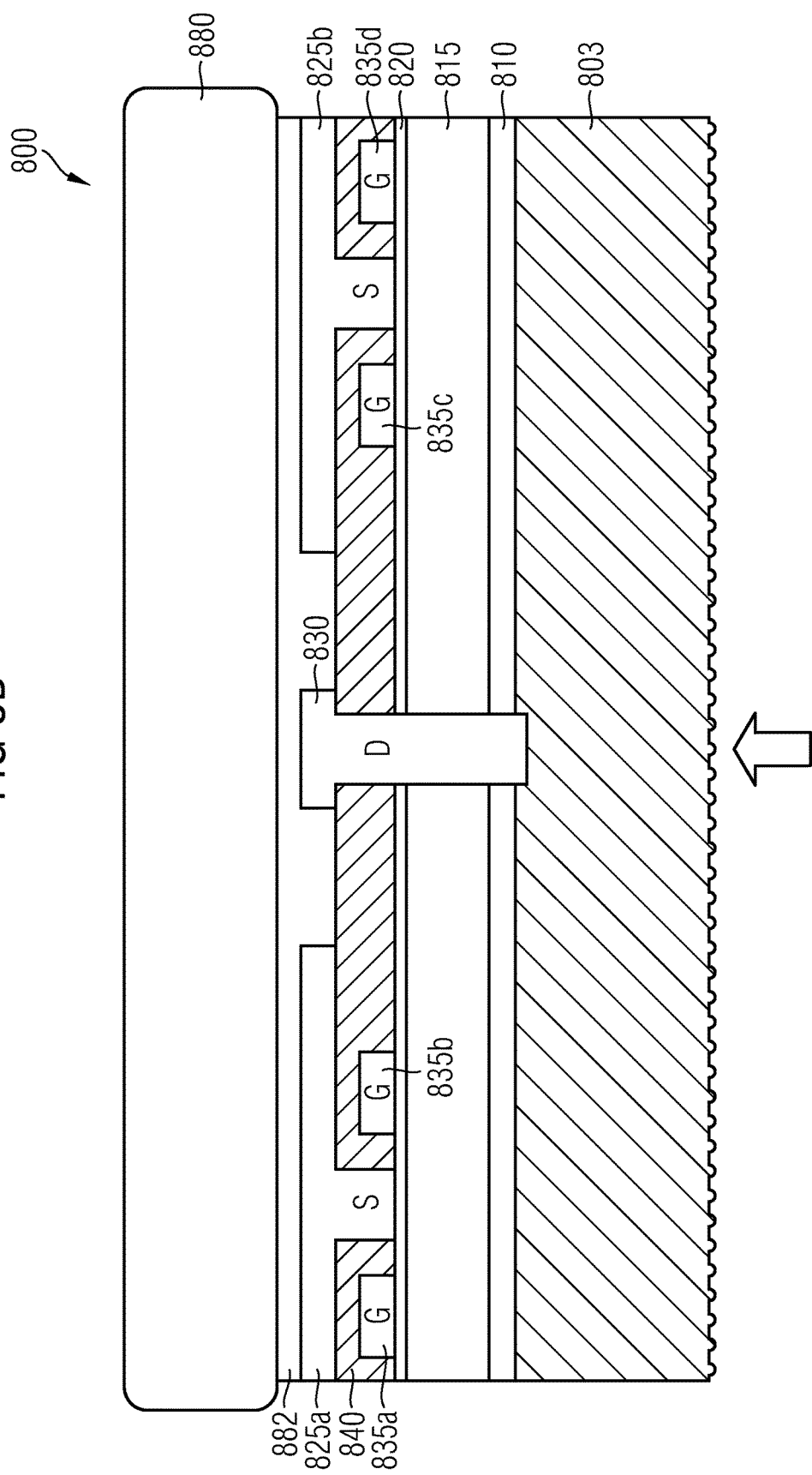

Referring to the schematic cross-sectional view of FIG. 8B, the semiconductor body 800 is attached with its front side to a first carrier 880, e.g. a glass carrier or a metal carrier. Between the carrier 880 and the semiconductor body 800, an adhesive 882 may be provided. Then the semiconductor carrier substrate 803 is removed, e.g. by grinding or etching. Removal of the semiconductor carrier substrate 803 may be purely mechanical with a stop on the buffer layer 810 or may start with a mechanical removal process followed by an etching process.

Figure 8C:
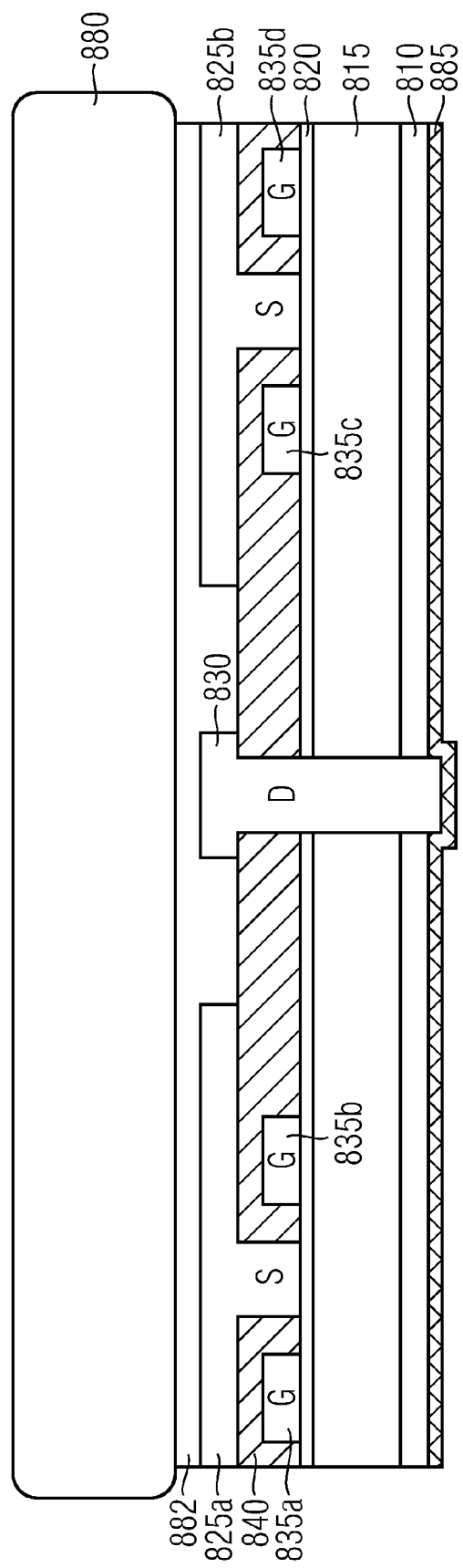

Referring to the schematic cross-sectional view of FIG. 8C, a seed layer 885 such as a Cu seed layer may be formed on the buffer layer 810 at a rear side of the semiconductor body 800. The seed layer 885 may be formed by sputtering, for example, and also covers a bottom side of the drain region 830 extending through an insulating layer 840, the second semiconductor layer 820, the first semiconductor layer 815 and the buffer layer 810.

Figure 8D:
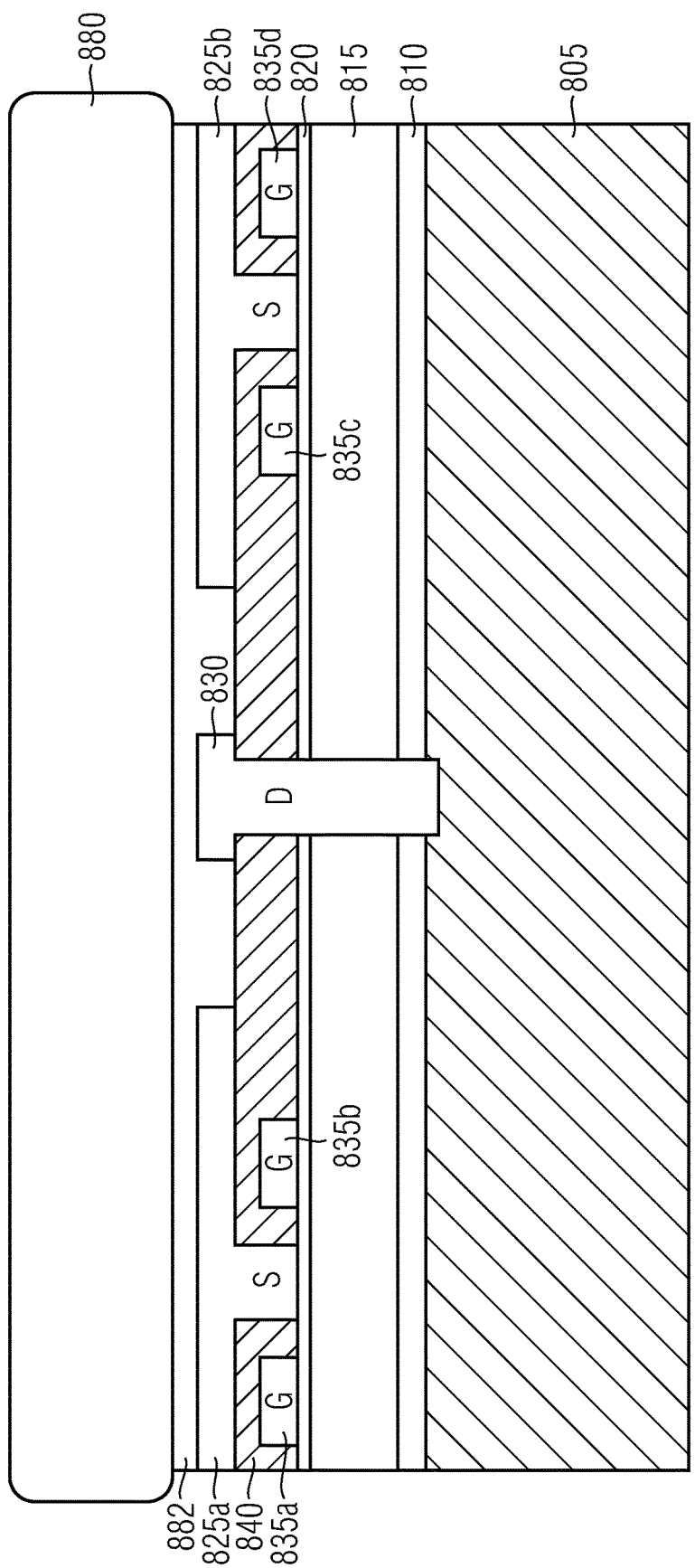

Referring to the schematic cross-sectional view of FIG. 8D, a metal is formed on the seed layer 885, e.g. by plating of Cu, to form a metal carrier substrate 810. The seed layer 885 may also be omitted and the metal, metal alloy or plurality of metal/metal alloys of the metal carrier substrate 810 may be formed on the buffer layer 810.

Referring to the schematic cross-sectional view of FIG. 8E, the semiconductor body 800 is attached, e.g. laminated, to a sawing foil 888 and the first carrier 880 as well as the adhesive 882 are released.

Further processes steps may follow to finalize nitride semiconductor power device including a metal substrate carrier for improved dissipation of heat during operation of the nitride semiconductor power device.

Figure 9C:
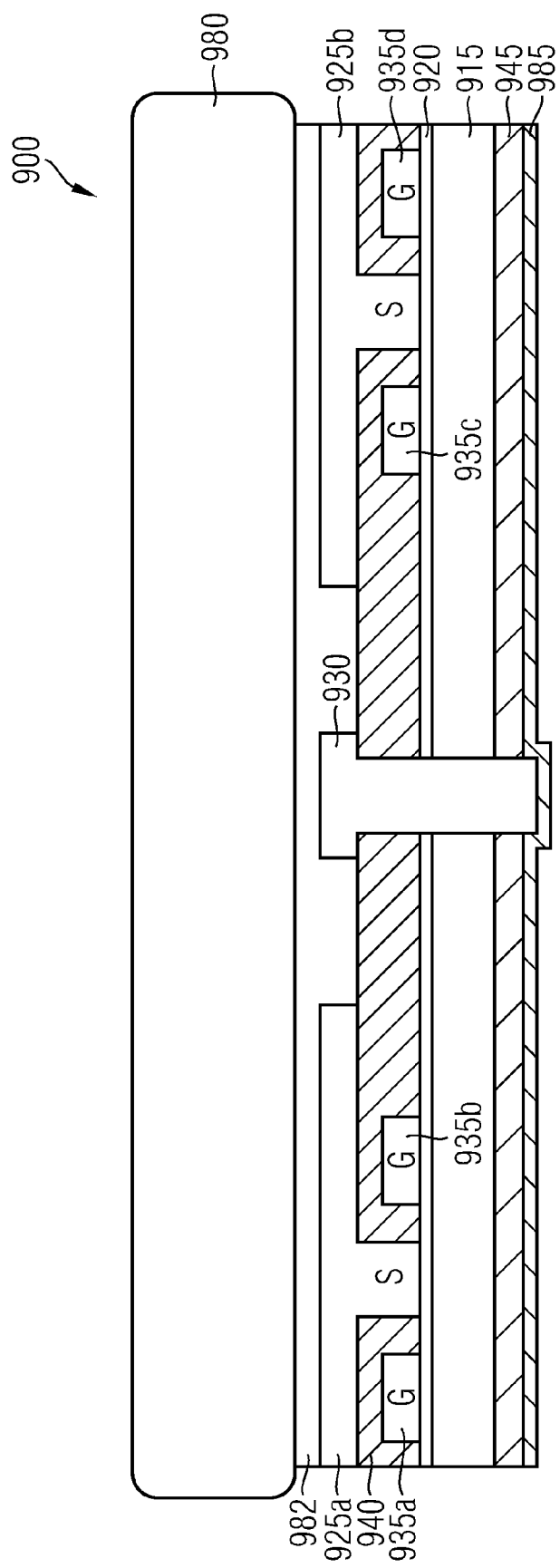

FIGS. 9A to 9C are cross-sectional views of one embodiment of a semiconductor portion during one example of manufacture of the nitride semiconductor power device similar to the one illustrated in FIG. 2.

Referring to the schematic cross-sectional view of FIG. 9A, a semiconductor body 900 is provided, the semiconductor body including a structure similar to the structure of semiconductor body 800 illustrated in FIG. 8A except that a third semiconductor layer including $Al_{x3}Ga_{y3}In_{z3}N$ (x3+y3+z3=1, x2>x3, y3≥0, z3≥0) is arranged between the buffer layer 910 and the first semiconductor layer 915. Similar to the process described with reference to FIG. 8B, the semiconductor body 900 is attached with its front side to a first carrier 980, e.g. a glass carrier or a metal carrier. Between the carrier 980 and the semiconductor body 900, an adhesive 982 may be provided. Then the semiconductor carrier substrate 903 is removed, e.g. by grinding or etching. Removal of the semiconductor carrier substrate 903 may be purely mechanical with a stop on the buffer layer 910 or may start with a mechanical removal process followed by an etching process.

As is illustrated in FIG. 9B, after removal of the carrier substrate 903, the buffer layer 910 is removed, e.g. by plasma etching. Thus the third semiconductor layer 945 is exposed at a rear side of the semiconductor body 900.

Then, as illustrated in FIG. 9C, a seed layer 985 similar to the seed layer 885 described with reference to FIG. 8C is formed. The seed layer may also be a multi-layer metal stack for low ohmic contact purposes. Thereafter, the seed layer may be thickened by a metal or metal alloy and further processes may be carried out to end up with to a nitride semiconductor power device as illustrated in FIG. 2.

FIG. 10A to 10D are cross-sectional views illustrating one embodiment of a semiconductor device including a semiconductor portion during one example of manufacture of a nitride semiconductor power device similar to the ones illustrated in FIGS. 3 to 6. In particular FIGS. 10A to 10D illustrate one embodiment of formation of a lowermost zone of the doped drift region.

Figure 10A:
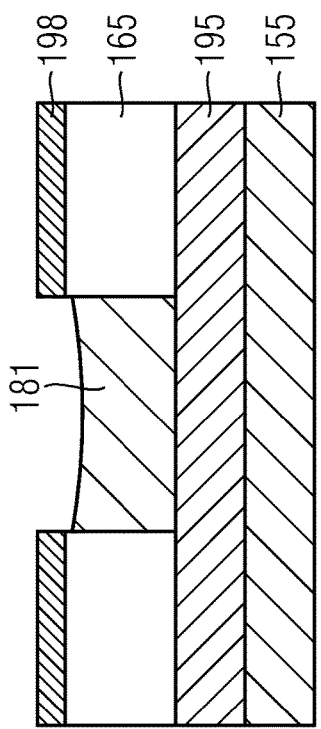
FIG. 10A to 10D are cross-sectional views illustrating one embodiment of a semiconductor portion during manufacture of a nitride semiconductor power device similar to the ones illustrated in FIGS. 3 to 6.

Referring to the schematic cross-sectional view illustrated in FIG. 10A, a doped third semiconductor layer of $Al_{x3}Ga_{y3}In_{z3}N$ (x3+y3+z3=1, x3≥0, y3≥0, z3≥0) and a first semiconductor layer are formed on a semiconductor carrier substrate 155 made of Si, SiC or GaN, for example.

Figure 10C:
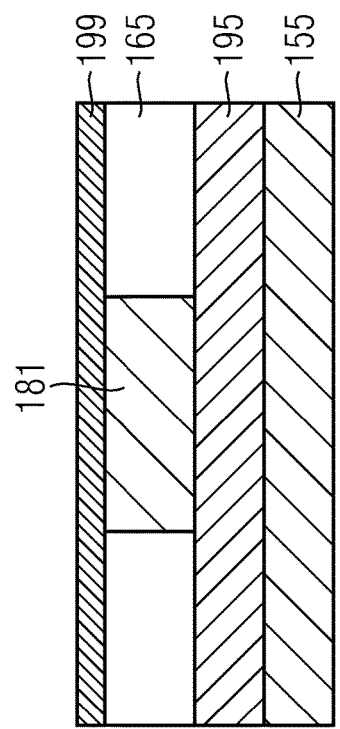
Figure 10B:
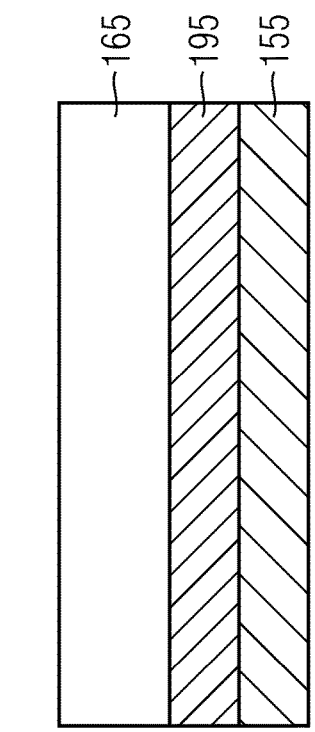

Referring to the schematic cross-sectional view illustrated in FIG. 10B, an aperture 191 is formed within the first semiconductor layer 165, e.g. by patterning a hard mask 198 on the first semiconductor layer 165 and etching through the first semiconductor layer 165 via the hard mask 198.

Then, as illustrated in the schematic cross-sectional view of FIG. 10C, a lowermost nitride semiconductor zone of the drift region 181 is formed within aperture 191 by selective epitaxy. This zone 181 may be doped in-situ to include a concentration of activated dopants higher than the first semiconductor layer 165.

Figure 10D:
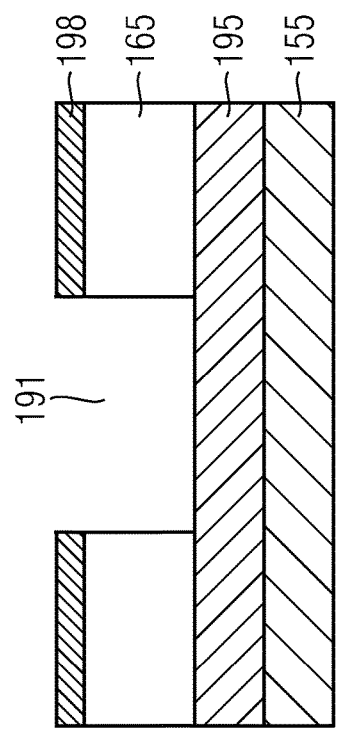

Then, as illustrated in the schematic cross-sectional view of FIG. 10D, a top surface of the lowermost nitride semiconductor zone of the drift region 181 is made planar, e.g. by chemical mechanical polishing (CMP). Thereby the hard mask 198 may be removed. A barrier layer 199 may be formed on the surface of the leveled surface.

The sequence of processes described with regard to FIGS. 10A to 10D may be repeated to form a plurality of doped semiconductor zones, e.g. avalanche regions, source, drain regions. As a further example, by repeating above sequence of processes, a continuous semiconductor region may be formed by a plurality of semiconductor zones in contact with each other, wherein the semiconductor zones may differ with regard to their dopant concentration. Thereby, a desired vertical dopant profile may be achieved, for example. As an example, a drift region may be formed by a plurality of doped semiconductor zones having different concentrations of dopants such that the concentration of dopants decreases from a rear side, i.e. at an interface with the third semiconductor layer 195, to the front side, cf. drift region 365 including zone 366 and 367 illustrated in FIG. 3.

It is to be understood that the features of the various embodiments described herein may be combined with each other unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. A method for manufacturing a semiconductor device, comprising:
   attaching a front side of a semiconductor body to a first carrier, the semiconductor body including, in a sequence from a rear side to the front side, a semiconductor carrier substrate, a buffer layer including AlN, a first semiconductor layer of $Al_{x1}Ga_{y1}In_{z1}N$ (x1+y1+z1=1, x1≥0, y1≥0, z1≥0) and a second semiconductor layer of $Al_{x2}Ga_{y2}In_{z2}N$ (x2+y2+z2=1, x2>x1, y2≥0, z2≥0);
   removing the semiconductor carrier substrate from the rear side;
   forming a metal substrate carrier on the rear side.

2. The method of claim 1, wherein
   forming the metal substrate carrier includes
   forming a seed layer of Cu on the rear side; and
   forming Cu on the rear side by galvanic plating.

3. The method of claim 2, wherein a thickness of the Cu on the rear side is between 15 μm to 50 μm.

4. The method of claim 2, wherein the seed layer of Cu is formed by a sputter process.

5. The method of claim 1, wherein
   forming the metal substrate carrier includes
   forming a seed layer on the rear side; and
   thickening the seed layer by a metal or metal alloy.

6. The method of claim 5, wherein the seed layer is formed as a multi-layer metal stack.

7. The method of claim 1, further comprising
   forming an aperture at least within the first semiconductor layer; and
   forming a conductive material within the aperture.

8. The method of claim 7, wherein
   forming the conductive material within the aperture includes forming a doped epitaxial semiconductor layer within the aperture.

9. The method of claim 8, wherein forming the doped epitaxial semiconductor layer includes in-situ doping and selective epitaxy.

10. The method of claim 1, further comprising
    forming source and drain regions electrically coupled to the second semiconductor layer; and
    forming gate regions on the second semiconductor layer.

11. The method of claim 10, wherein forming the drain region includes forming a conductive part extending through the second and first semiconductor layers and through the buffer layer to the semiconductor carrier substrate before removing the semiconductor carrier substrate from the rear side.

12. The method of claim 1, wherein the semiconductor device is a formed as a nitride semiconductor power device.

13. The method of claim 1, wherein the semiconductor carrier substrate is removed from the rear side by grinding or etching.

14. The method of claim 1, wherein the semiconductor carrier substrate is made of one of Si, SiC and GaN.

15. A method for manufacturing a semiconductor device, comprising:
    attaching a front side of a semiconductor body to a first carrier, the semiconductor body including, in a sequence from a rear side to the front side, a semiconductor carrier substrate, a buffer layer including AlN, a first semiconductor layer of $Al_{x1}Ga_{y1}In_{z1}N$ (x1+y1+z1=1, x1≥0, y1≥0, z1≥0) a second semiconductor layer of $Al_{x2}Ga_{y2}In_{z2}N$ (x2+y2+z2=1, x2>x1, y2≥0, z2≥0) and a drain region having a conductive part extending though the second semiconductor layer, the first semiconductor layer, and the buffer layer to the semiconductor carrier substrate;
    removing the semiconductor carrier substrate from the rear side; and
    forming a metal substrate carrier on the rear side.

16. The method of claim 15, wherein the drain region extends into the semiconductor carrier substrate.

17. The method of claim 15, the semiconductor body including source regions contacting the second semiconductor layer and gate regions formed on the second semiconductor layer.

18. The method of claim 17, the semiconductor body including one or more insulating regions formed between the source regions and the gate regions.

19. The method of claim 15, including an insulating region formed between the drain region and the second semiconductor layer.

20. The method of claim 15, comprising:
    attaching a sawing foil to the metal substrate carrier; and
    releasing the first carrier.

21. The method of claim 15, wherein the second semiconductor layer is capped with a thin layer of GaN.

22. The method of claim 15, where the second semiconductor layer is a doped semiconductor layer.

* * * * *